United States Patent [19]

Gaier et al.

[11] 3,753,809

[45] Aug. 21, 1973

[54] METHOD FOR OBTAINING OPTIMUM PHOSPHOROUS CONCENTRATION IN SEMICONDUCTOR WAFERS

[75] Inventors: Claude E. Gaier, Pleasant Valley; Edward G. Grochowski; Maurice M. Roy, both of Wappingers Falls, all of N.Y.

[73] Assignee: International Business Machines Corporation, Armonk, N.Y.

[22] Filed: Jan. 9, 1970

[21] Appl. No.: 1,632

[52] U.S. Cl. .................. 148/189, 148/186, 148/187, 252/62.3 E

[51] Int. Cl. .................. H01l 7/44

[58] Field of Search .................. 148/189, 188

[56] References Cited

UNITED STATES PATENTS

| | | | |
|---|---|---|---|
| 3,442,725 | 5/1969 | Huffman et al. | 148/189 |
| 3,247,032 | 4/1966 | Griswold | 148/188 |
| 3,607,468 | 9/1971 | Chang et al. | 148/186 |
| 3,644,154 | 2/1972 | Hoogendoorn et al. | 148/187 |
| 3,507,716 | 4/1970 | Nishida et al. | 148/187 |

*Primary Examiner*—G. T. Ozaki
*Attorney*—Hanifin and Jancin and Frank C. Leach, Jr.

[57] ABSTRACT

A selected source concentration of $POCl_3$ is passed over a plurality of wafers in a furnace in a turbulent flow by positioning baffles between the source of the concentration and the wafers and a baffle on the side of the wafers remote from the source. This turbulent flow produces substantial uniformity of the phosphorous concentration in each of the wafers. By selecting the source concentration of $POCl_3$ in accordance with the flow rate, a substantially straight junction is formed in each of the wafers by the diffusion of the phosphorous into the wafers.

9 Claims, 3 Drawing Figures

INVENTORS
CLAUDE E. GAIER
EDWARD G. GROCHOWSKI
MAURICE M. ROY

BY Frank C. Leach Jr.

ATTORNEY

METHOD FOR OBTAINING OPTIMUM PHOSPHOROUS CONCENTRATION IN SEMICONDUCTOR WAFERS

In the formation of NPN transistors in monolithic integrated circuits, it is necessary to form sufficient phosphosilicate glass (PSG) to obtain the desired gettering of impurities in the semiconductor device such as a transistor, for example, whereby the efficiency of the transistor is increased. While it is necessary for the gettering glass to be deposited on the N concentration region of the emitter, it also is necessary to limit the concentration of the phosphorous in the emitter region.

As the concentration of the phosphorous in the emitter region increases beyond $4 \times 10^{20}$ atoms/cm$^3$ at a diffusion temperature of 970° C., the efficiency of the emitter of a transistor is lowered due to the increased concentration of phosphorous causing dislocations in the lattice of the silicon wafer. Accordingly, it is necessary to obtain sufficient deposition of phosphorous to produce a desired thickness of PSG to getter the impurities from the transistor while still not having the concentration of the emitter region exceed a predetermined value.

When attempting to diffuse a large number of wafers at the same time with phosphorous and particularly wafers of a substantially large diameter, there must be substantially uniform diffusion of the phosphorous into each of the wafers for each of the wafers to have the desired gettering glass thereon while still controlling the concentration of phosphorous in the emitter region in each of the wafers. Thus, if the wafers, which are remote from the point of introduction of phosphorous into the furnace or heating chamber, do not receive substantially the same diffusion of phosphorous as the wafers closest to the point of phosphorous introduction, there will be a very substantial difference in both the thickness of the gettering glass and the concentration of the phosphorous in the emitter region of the wafers so as to lower the yield of the wafers.

If the diffusion of phosphorous into the wafers depends only on diffusive flow, which is determined by the concentration of the impurity, there will be a very substantial difference in the concentration of the phosphorous in the plurality of wafers in the furnace. This is because there will be a substantially greater diffusion into the wafers over which the phosphorous first passes whereby the phosphorous concentration available for diffusion decreases as the phosphorous and its carrier gas move towards the wafers remote from the furnace inlet of the phosphorous. Therefore, if there is dependence upon only diffusive flow for diffusing phosphorous into a large number of wafers at the same time and particularly where the wafers are of relatively large diameter, the yield of the wafers will be relatively low because of the substantial difference in both the thickness of the gettering glass and the concentration of the phosphorous in the emitter region of the wafers.

The present invention satisfactorily solves the foregoing problem by providing an apparatus in which there is sufficient turbulent flow of phosphorous and its carrier gas to obtain substantially uniform diffusion of phosphorous into each of the wafers within the furnace. The term "turbulent flow" is used throughout the specification and claims to means that the flow includes flow in directions other than parallel to the axis of the furnace in addition to parallel to the axis of the furnace. Accordingly, by using the apparatus of the present invention, each of the wafers in the furnace receives a substantially uniform diffusion of phosphorous.

The apparatus of the present invention insures that there is turbulent flow of the phosphorous and its carrier gas for duffision into each of the silicon wafers. By selecting the source concentration of the phosphorous in a range in which there is no difference in the junction thickness for a specific diffusion temperature irrespective of the variation of the phosphorous source concentration in this range, the method and apparatus of the present invention are capable of producing an emitter region in which the concentration of phosphorous atoms in the emitter region is controlled while still being high enough to form the desired thickness of PSG to getter the impurities from the transistor.

By utilizing turbulent flow and selecting a source concentration of phosphorous in a specified range, the method of the present invention produces a junction that is substantially straight so that it is free of ragged regions. As a result, the method of the present invention is capable of eliminating pipes between the emitter and the collector of a transistor. This substantially increases the yield of semiconductor devices formed according to the method and apparatus of the present invention since there is no shorting between the emitter and the collector due to pipes while there is still ample PSG to remove impurities from the device.

It should be understood that the total flow rate of the phosphorous and its carrier gas through the furnace is as high as possible to promote good mixing of the gases. However, the flow rate also must be selected so that it is not so high as to produce a cooling problem within the furnace since a very high flow rate would cool the furnace and particularly the wafers closest to the inlet of the phosphorous and its carrier gas. Therefore, it is necessary to select the flow rate in accordance with the geometry of the furnace, the position of the wafers with respect to the flow direction, and the wafer support to obtain the correct flow rate of phosphorous through the furnace.

The apparatus of the present invention obtains the desired turbulent flow through utilizing baffle means adjacent the inlet of the phosphorous and its carrier gas to produce substantial mixing to cause turbulent flow of the gaseous mixture before it flows over the wafers. Furthermore, the present invention contemplates baffle means adjacent the sides of the wafers remote from the entrance of the gaseous mixture to the furnace to insure turbulent flow across the wafers most remote from the gaseous mixture inlet to the furnace.

Accordingly, in the present invention, the velocity gradient produces a greater uniform rate of diffusion into each of the wafers than the concentration gradient. Therefore, since diffusion in the present invention is not dependent upon the concentration gradient, substantially uniform diffusion of phosphorous in all of the wafers is obtained.

The present invention also permits the selection of a desired depth of the junction between the emitter and base region. Thus, by selecting the temperature and time and/or utilizing various sized heating chambers with various flow rates, the depth of the junction between the emitter and the base may be readily controlled.

An object of this invention is to provide a method and apparatus for producing a substantially straight junction in a semiconductor device.

Another object of this invention is to provide a method and apparatus for precisely controlling the junction depth in a semiconductor device produced during diffusion while obtaining desired gettering.

A further object of this invention is to provide a method and apparatus for controlling the phosphorous concentration diffused into a semiconductor device so as to obtain gettering of impurities from he device.

The foregoing and other objects, features, and advantages of the invention will be more apparent from the following more particular description of the preferred embodiement of the invention as illustrated in the accompanying drawings.

Figure 1:
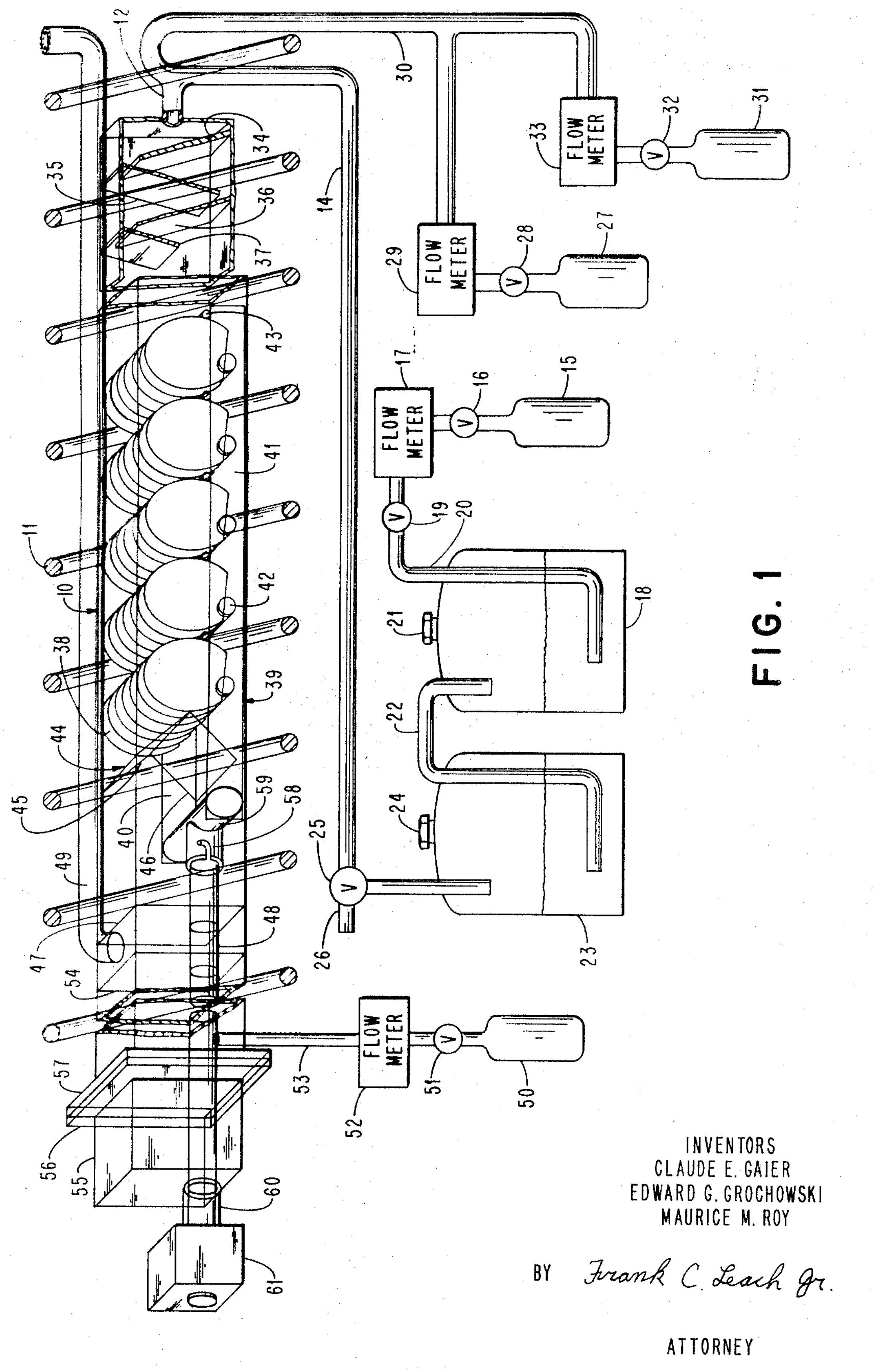
FIG. 1 is a schematic view of the apparatus of the present invention in which the method of the present invention may be carried out.

Referring to the drawings and particularly FIG. 1, there is shown an apparatus of the present invention for carrying out the method of the present invention and in which various tests, which are mentioned hereinafter, were carried out. The apparatus includes a heating chamber 10 of quartz having a rectangular cross section with an electrical resistance heating coil 11 disposed in surrounding relation thereto to heat the chamber 10 to the desired temperature.

Phosphorous enters the heating chamber 10 by means of a carrier gas through a quartz tube 12 at one end of the heating chamber 10. Phosphorous, which is initially in the form of liquid $POCl_3$, is directed to the tube 12 from a glass tube 14 by means of a carrier gas, which is nitrogen.

Nitrogen is supplied from a pressurized bottle 15 and a valve 16 to a flowmeter 17. By means of the valve 16, the flow from the pressurized bottle 15 is controlled in accordance with the reading of the flowmeter 17. This produces the desired flow rate of the nitrogen to a source flask 18.

A valve 19 is disposed between the flowmeter 17 and the source flask 18 in a glass tube 20, which extends from the valve 19 to the lower portion of the source flask 18 in which liquid $POCl_3$ is disposed. The valve 19 isolates the flowmeter 17 from the source flask 18 except when phosphorous is to be supplied to the heating chamber 10 since the liquid $POCl_3$ is corrosive.

The tube 20 has a frit at its end to cause bubbling of the nitrogen into the liquid $POCl_3$ in the source flask 18. The source flask 18 has a cap 21 on its top to permit the supply of liquid $POCl_3$ to the source flask 18, which is maintained at room temperature.

A glass tube 22 connects the source flask 18 with a source flask 23, which also contains liquid $POCl_3$. The end of the tube 22 has a frit thereon to cause bubbling of the nitrogen, which already has $POCl_3$ entrained therein from the source flask 18, through the liquid $POCl_3$ in the source flask 23. The source flask 23 has a cap 24 thereon to allow supply of liquid $POCl_3$ to the source flask 23.

The source flask 23 is maintained at a temperature of 20° C. This may be accomplished by any well-known means such as disposing the source flask 23 in a thermostated bath (not shown), for example.

The Nitrogen carrier gas with $POCl_3$ entrained therein as vapor escapes from the source flask 23 through the tube 14, which has a two-way valve 25 therein. Accordingly, the valve 25 either allows flow from the source flask 23 to the tube 12 through the tube 14 or to the atmosphere through an exhaust glass tube 26.

While the apparatus has beenshown as having the source flask 18 and the source flask 23 in series, this arrangement has been shown only to depict the apparatus that was utilized to perform various tests. It was determined during the tests that the source flask 18 is not necessary irrespective of the desired concentration of the phosphorous.

Oxygen is supplied to the tube 12 from a pressurized bottle 27. A valve 28 controls the flow of oxygen from the bottle 27 to a flowmeter 29 whereby the desired oxygen flow rateis obtained. The flowmeter 29 communicates with a glass tube 30, which leads to the tube 12.

Additional nitrogen is supplied from a pressurized bottle 31. A valve 32 controls the flow of nitrogen from the bottle 31 in accordance with the reading of a flowmeter 33. The flowmeter 33 communicates with the tube 30 whereby the nitrogen from the bottle 31 mixes therein with the oxygen in the bottle 27.

Accordingly, the total flow to the tube 12 comprises the oxygen flowing from the bottle 27, the nitrogen flowing from the bottle 31, and the nitrogen, which has the $POCl_3$ entrained therein, flowing from the source flask 23. These flow ates are regulated so that about 20 percent by volume of the gas is oxygen. This is to have the necessary oxygen for reacting with $POCl_3$ to produce PSG.

Each of the bottles 15, 27, and 31 injects the gas into the system at a pressure of 30 p.s.i. gauge This results in a pressure gradient in the heating chamber 10 since the heating chamber 10 communicates with the atmosphere.

As nitrogen with entrained $POCl_3$ and oxygen enter the heating chamber 10, they are directed over the upper end of a baffle 34 of quartz. The baffle 34 is inclined upwardly away from the tube 12. The baffle 34 has a tight fit with the bottom and side walls of the heating chamber 10 so that the gases must flow over the top end of the baffle 34. The baffle 34 is preferably supported by the bottom and side walls of the heating chamber 10.

A second baffle 35 of quartz is disposed adjacent the baffle 34 and is inclined downwardly away from the tube 12. The baffle 35 has a tight fit with the upper and side walls of the heating chamber 10 so that the gases must pass beneath the bottom end of the baffle 35. The baffle 35 is preferably supported by the upper and side walls of the heating chamber 10.

A third baffle 36 of quartz extends upwardly from the bottom wall of the heating chamber 10 and is inclined away from the conduit 12. The baffle 36, which is disposed adjacnet the baffle 35, has a close fit with the bottom wall and he side walls of the heating chamber 10 so that the gases must pass over the top end of the baffle 36. The baffle 36 is preferably supported by the bottom and side walls of the heating chamber 10.

A baffle 37, which has a length approximately half of the length of each of the baffles 34–36, is disposed adjacent the upper end of the baffle 36 and inclined downwardly away from the tube 12. The baffle 37 of quartz has a tight fit with the upper wall of the heating chamber 10 and with the side walls of the heating chamber 10 fo the distance along which the baffle 37 extends. As a result, the gases must pass beneath the lower end of the baffle 37. The baffle 37 is preferably supported by theupper and side walls of the heating chamber 10.

As a result of the baffles 34–37, there is a mixing of nitrogen, oxygen, and $POCl_3$ so that there is a homogeneous mixture before any passage occurs over a plurality of wafers 38 in the heating chamber 10. This baffle means also creates a turbulent flow within the heating chamber 10 as the gases exit from beneath the lower end of the baffle 37.

After the gases glow beneath the lower end of the baffle 37, the mixture passes over the wafers 38, which are supported on a boat 39. The boat 39 comprises a pair of rails 40 and 41 of quartz having slotted rods 42 of quartz extending therebetween and connected thereto to receive the wafers 38. The boat 39 also has non-slotted rods 43 of quartz extending between the rails 40 and 41 and connected thereto to aid in holding the wafers 38 on the boat 39.

A baffle 44 of quartz is supported on the boat 39 on the side of the boat 39 remote from the baffles 34–37. The baffle 44 includes an inclined upper portion 45 and an inclined lower portion 46 with each of the portions 45 and 46 being inclined so that their junction is toward the tube 12. The baffle 44 is spaced slightly from each of the walls of the heating chamber 10 so that the mixture of nitrogen, oxygen, and $POCl_3$ may escape therebetween. However, the baffle 44 functions to insure additional turbulence around the wafers 38, which are farthest from the inlet tube 12.

This arrangement insures that there is a substantial uniform diffusion of phosphorous from the $POCl_3$ in the gas mixture on each of the wafers 38. This is because the velocity gradient governs the diffusion rather than the concentration gradient.

The gas mixture including any $POCl_3$, which has not been deposited on the wafers 38, passes between a blade 47, which is of quartz and supported on a control rod 48 of quartz, and the walls of the heating chamber 10 to escape to the atmosphere through an exhaust tube 49 of quartz. As previously mentioned, this creates the pressure gradient in the heating chamber 10.

There is a back flow of nitrogen into the heating chamber 10 at the end remote from the introduction tube 12. The nitrogen is supplied from a pressurized bottle 50. The flow from the bottle 50 is controlled by a valve 51 to produce the desired flow in accordance with a flowmeter 52 through which the nitrogen passes. A glass tube 53 connects the flowmeter 52 with the heating chamber 10 adjacent the wafer entrance to the heating chamber 10 so that the nitrogen flows therefrom into the heating chamber 10 and past a blade 54, which also is supported on the control rod 48 a predetermined spaced distance from the blade 47. The nitrogen flows past the blade 54, hich is of quartz and spaced slightly from each of the walls of the heating chamber 10, and into the exhaust tube 49.

This backflow arrangement insures that no phosphorous reaches the wafer entrance end of the heating chamber 10 remote from the tube 12. As a result, there is no formation of phosphorous pentoxide ($P_2O_5$) adjacent the wafer entrance end of the heating chamber 10. This phosphorous pentoxide could become phosphoric acid and cause contamination in the heating chamber 10 to prevent the desired phosphorous concentration in the wafers 38.

The wafer entrance end of the heating chamber 10 is closed by an end cap 55, which is of quartz and has a flange 56 thereon for cooperation with a flange 57 on the heating chamber 10. The flanges 56 and 57 are clamped to each other by uitable clamping means (not shown).

The control rod 48 extends through the end cap 55 into the heating chamber 10 to not only properly position the blades 47 and 54 therein on opposite sides of the exahust tube 49 but also to properly dispose the boat 39 in the desired area within the heating chamber 10. When the heating chamber 10 has a length of four feet, for example, only he twelve inches in the central portion of the heating chamber 10 is a flat zone where the temperature is substantially constant.

The control rod 48 cooperates with a bayonet slot in a tube 58 of the boat 39. The tube 58 is integral with a connecting rod 59, which is of quartz and extends between the rails 50 and 41 of the boat 39 to join the rails 40 and 41 to each other at one end thereof. The rods 52 and 43 also aid in holding the rails 40 and 41 connected to each other.

The control rod 48 passes through a tube 60 of quartz on the end of the end cap 55 remote fromthe flange 56. A seal 61, which is formed of Teflon, for example, is fitted over the end of the control rod 48 so as to form a seal therewith and with the end of the tube 60 remote from the end cap 55. As a result, there can be no leakage of any of the gas, which is within the heating chamber 10, through the passage in the end cap 55 for the control rod 48.

After the mixture of nitrogen, oxygen, and $POCl_3$ has passed over the wafers 38 for a predetermined period of time to diffuse phosphorous into the wafers 38, the wafers 38 are removed from the heating chamber 10 and disposed in another heating chamber or furnace in which there is an oxidizing atmosphere. This is known as the drive-in step of a two step diffusion.

Tests were run on groups of wafers in three different runs. Each of the wafers had previously been processed to form the collector and the base regions therein so that only the emitter diffusion was required.

In processing each of the wafers tested to produce the collector and base regions in the wafer, a wafer of P-type conductivity was used. The wafer had a resistivity of approximately 10–20 ohm-cm and a thickness of about 2 to 20 mils. Each of the wafers was monocrystalline silicon.

In forming each wafer for device fabrication, a silicon dioxide coating, which has a thickness of 5000A, was thermally grown on a surface of the wafer by conventional heating in a wet atmosphere at 1050° C. for 60 minutes. By standard photolithographic masking and etching techniques, a photoresist layer was deposited over the surface of the silicon dioxide layer on the wafer to form a mask. Through the use of the photoresist layer as a mask, a region on the surface of the wafer was exposed through a hole in the silicon dioxide layer by etching away the desired portion of the silicon dioxide layer with a buffered HF solution. The photoresist layer was then removed to permit further processing.

An N+ region, which has a surface concentration of $10^{20}$ atoms/cm$^3$, was formed in the wafer by diffusion through the hole in the silicon dioxide layer. This diffusion was carried out in a conventional evacuated quartz capsule with an arsenic doped silicon powder as the dopant source.

After completion of diffusion of the N+ region, the layer of silicon dioxide was removed with a buffered HF solution. A layer of N-type conductivity, which has a resistivity of 0.18–0.22 ohm-cm and a surface concentration of about $3 \times 10^{16}$ atoms/cm$^3$, was epitaxially grown on the surface of the wafer. The epitaxial layer was arsenic doped and had a thickness of approximately 6–7 microns. During the epitaxial growth, the N-type impurities in the N+ region outdiffused about 2 microns.

A circumscribing region of P+ type isolation was provided, for example, by diffusing boron in the appropriate concentration, through the openings, into the epitaxial layer to a depth that extends into the substrate to fully PN junction isolate designated regions of semiconductor with the epitaxial layer. The P+ region, which has a surface concentration of $5 \times 10^{20}$ atoms/cm$^3$, was formed in the wafer by the previously mentioned capsule diffusion technique using boron doped silicon powder as the dopant source. Typically, the diffusion temperature was 1200° C. followed by a 1150° C. drive-in cycle.

The openings were re-oxidized during this cycle and another photolithographic masking and etching procedure was accomplished to open holes int e oxide layer above a selected region of the epitaxially grown layer. The P type base region was then diffused into the appropriate isolated epitaxially gornw region above the buried N+ regions. This occurred in a capsule, similar to the previously mentioned capsule, at 1075° C. The exposed surface of the epitaxial layer was then oxidized in a suitable oxidizing atmosphere at 1100° C. During the oxidation, the impurities were caused to be driven-in to completely form the base.

The emitter region was then obtained by photolithographic masking and etching to open holes in the desired areas of the silicon dioxide layer and diffusing N type impurities into the desired portion of the base region. The surface of the epitaxial layer was again oxidized and the impurities were driven-in to form the complete emitter region.

The surface was again masked and holes were etched in the oxide for forming the contact openings to the desired semiconductor regions. A suitable contact metal was then evaporated or deposited by other means onto the semiconductor regions through the openings in the insulating coating. The contact material was aluminum. However, other well-known metals in the art can be used such as platinum and palladium, for example.

The wafers were oriented in both <100> and <111> directions. The first two runs were made with only the source flask 23 and with the source flask 18 omitted. The third group was made by using both the source flasks 18 and 23.

The cycle time for each $POCl_3$ deposition was a five minute purge with nitrogen/of the heating chamber 10, a deposition for 30 minutes, and another five minute purge of the heating chamber 10 with nitrogen. This was carried out at a temperature of 970° C.

In the drive-in reoxidation, which was carried out in another furnace and in an oxidizing atmosphere in the well-known manner, dry oxygen was supplied for five minutes, then stem plus dry oxygen was supplied for 55 minutes, and finally 25 minutes of dry oxygen was supplied. This processs also was carried out at 970° C.

It should be understood that each of the groups of wafers included at least one, preferably a plurality, of control wafers. Each of the control wafers was of P-type conductivity with a resistivity of about 2 ohm-cm and the same thickness as the device wafer. It should be further understood that the control wafers received only the emitter diffusion.

In the first run, the control and device wafers were divided into five groups. These groups are identified as A-E with each receiving phosphorous from a source of $POCl_3$. The source concentration of $POCl_3$ in parts per million (ppm) for each of groups A-E were as follows:

| Group | Concentartion |
|---|---|
| A | 500 |
| B | 600 |
| C | 700 |
| D | 800 |
| E | 1100. |

In this run, after removal from the heating chamber 10, the following steps occurred with $Rs_1$ being the sheet resistance after deposition and before drive-in and $Rs_2$ being the sheet resistance after drive-in:

1. Measure $Rs_1$;
2. Drive-in reoxidation;
3. Angle section devices for pipes;
4. Measure control wafer $X_j$ and PSG;
5. Observe junction quality;
6. Gold diffusion (one-half backside etched- one-half sandblast);
7. Angle section devices for pipes; and
8. Measure device and control wafer $X_j$ and $Rs_2$.

In the second run, the wafers were again divided into five groups, namely Groups E'-I with each group receiving phosphorous from a source of $POCl_3$. The source concentration of $POCl_3$ in ppm for each of groups E'-I were as follows:

| Group | Concentration |
|---|---|
| E' | 500 |
| F | 1100 |
| G | 1500 |
| H | 2000 |
| I | 4000. |

In this second run, the following steps occurred after removal of the wafers from the heating chamber 10:

1. Measure $Rs_1$;
2. Angle section devices for pipes;
3. Drive-in reoxidation;
4. Angle section devices for pipes;
5. Measure control wafer $X_j$ and PSG;
6. Observe junction quality;
7. Gold diffusion (one-half with gold - one-half no gold);
8. Angle section devices for pipes; and
9. Measure device and control wafer $X_j$ and $Rs_2$.

In the third run, the groups were initiall divided into three groups but then additional groups were processed so that a total of seven groups, namely, groups J-P were processed. The source concentration of $POCl_3$ in ppm for each of groups J-P were as follows:

| Group | Concentration |
|---|---|
| J | 800 |
| K | 1200 |
| L | 1500 |
| M | 2000 |
| N | 2500 |
| O | 3000 |
| P | 4000. |

The following steps were preformed on each of the wafers in the third run after they were removed from the heating chamber 10:

1. Measure $Rs_1$;
2. Drive-in reoxidation;
3. Angle section devices for pipes;
4. Measure control wafer $X_j$ and PSG;
5. Observe junction quality;
6. Gold diffusion;
7. Angle section devices for pipes; and
8. Measure device and control wafer $X_j$ and $Rs_2$.

During the third run, the source flask 18 was employed. However, later tests indicated that this is not necessary but the source flask 18 has been shown in FIG. 1 to illustrate the equipment employed for running tests in the third run.

For each of the three runs, the relationship of the source concentration of $POC1_3$ to the sheet resistance both after deposition and after drive-in with the sheet resistance being indicated only for wafers having <100> oreinted crystals since the sheet resistance is independent of crystal orientation and to thejunction depth for <100> and <111> orientations are as follows:

| Group | $Rs_2$ <100> | <100> | $X_j$ °100> Mils | <111> Mils |
|---|---|---|---|---|
| A | 17.3 | 13.2 | .067 | 0.74 |
| B | 14.3 | 11.1 | .071 | .077 |
| C | 12.8 | 8.9 | .077 | .083 |
| D | 11.7 | 8.3 | .076 | .085 |
| E | 9.7 | b 7.1 | .079 | .088 |

| Group | $Rs_1$ <100> | $Rs_2$ <100> | $X_j$ <100> Mils | <111> Mils |
|---|---|---|---|---|
| E' | 17.1 | 12.2 | .068 | .075 |
| F | 9.8 | 7.1 | .073 | .083 |
| G | 8.4 | 5.9 | .077 | .082 |
| H | 7.6 | 5.5 | .078 | .082 |
| I | 6.5 | 4.7 | .063 | .063 |

| Group | $Rs_1$ <100> | $Rs_2$ <100> | $X_j$ <100> Mils | <111> Mils |
|---|---|---|---|---|
| J | 11.6 | 8.5 | .070 | .077 |
| K | 9.4 | 6.4 | .073 | .076 |
| L | 8.4 | 5.5 | .074 | .080 |
| M | 7.5 | 4.8 | .075 | .079 |
| N | 7.1 | 4.5 | .073 | .061 |
| O | 6.8 | 4.3 | .076 | .061 |
| P | 6.4 | 4.2 | .063 | .061. |

It should be understood that the sheet resistances, $Rs_1$ <and $Rs_2$, are in ohms per square.

The relationship of the source concentration of $POC1_3$ in the wafer relative to its junction depth is plotted in FIG. 2 and is based on the results set forth hereinabove in relating the junction depth for <100> and <111> orientations to the source concentration of $POC1_3$.

The yield (number of acceptable product units in relation to number processed expressed in percent) and electrical test data results for the wafers of the first run with Vcc-Gnd (common collector voltage-ground) being a positive voltage of 1.2 volts are as follows:

| Group | Vcc-Gnc Normal, 20 Chips Per Wafer | Pipes per Group, 30 Transistors per Wafer Probed | Final Elec. Yield No. of Chips (64 & 63 Bit Chips) Tested | Yield |
|---|---|---|---|---|
| A | 0% | 2/120 | 614 | 0.0% |
| B | 2.5% | 2/120 | 609 | 1.5% |
| C | 11% | 0/120 | 659 | 2.4% |
| D | 29% | 5/120 | 609 | 3.6% |
| E | 40% | 1/60 | 189 | 3.2% |
| Etched backside | 17% | 5/270 | 1398 | 1.8% |
| sandblast | 11% | 5/270 | 1282 | 2.2% |

As shown by the foregoing tale for the first run, the quality increases with an increased $POC1_3$ source concentration. Furthermore, the method of preparation of the backside of the wafer has little effect on the quality.

The yield and electrical test data results of the second run ith Vcc-Vn (common collector voltage-substrate power supply voltage) being a voltage of -3 volts are as follows:

| | Vcc-Gnd normal | | Vcc-Gnd+Vcc-Vn normal | | Pipes found | |
|---|---|---|---|---|---|---|
| Group | Sub-groups | Groups | Sub-groups | Groups | Sub-groups | Groups |
| E'—no Au | 57% | | 12% | | 1/100 | |
| E'—Au | 16% | | 9% | | 8/100 | |
| E'—total | | (30%) | | (10%) | | 9/200 |
| F—no Au | 28% | | 8% | | 1/100 | |
| F—Au | 18% | | 2% | | 5/100 | |
| F—total | | (23%) | | (5%) | | 6/200 |
| G—no Au | 32% | | 6% | | 0/100 | |
| G—Au | 11% | | 0% | | 0/100 | |
| G—total | | (25%) | | (4%) | | 0/200 |
| H—no Au | 42% | | 8% | | 0/100 | |
| H—Au | 32% | | 11% | | 0/100 | |
| H—total | | (38%) | | (9.5%) | | 0/200 |
| I—no Au | 39% | | 11% | | 1/100 | |
| I—Au | 42% | | 15% | | 1/100 | |
| I—total | | (41%) | | (13.5%) | | 2/100 |
| No gold | | 38% | | 8% | | 3/500 |
| Gold | | 25% | | 8% | | 14/500 |

The foregoing table for the second run indicates that the pipe density increases with gold but the effect of gold on the pipe density is reduced as the $POC1_3$ source concentration increases. It is believed that the two pipes found in Group I of the second run are a result of ragged junctions.

The yield and electrical data results for three of the groups of the third run, namely, Groups J, M, and P are as follows:

| Group | Vcc-Gnd Normal | Pipes Found/ Transistors Probed | Final Test Yield Chips Tested | yield |
|---|---|---|---|---|
| J | 19% | 5/150 | 431 | 1.63% |
| M | 54% | 0/300 | 1081 | 5.46% |
| P | 51% | 0/350 | 1275 | 4.94% |

The quality of either group M or P is three times the quality of Group J. Furthermore, pipes were detected only in Group J.

Some additional electrical parameters for each of Groups J. M. and P are as follows:

| Group | $\frac{FV_{beo}}{d}$ (2 ma.) | $\frac{V_{bes}}{d}$ (0.1 ma.) | $\frac{B}{d}$ (3 ma.) | $\frac{V_{ces}}{d}$ (3 ma.. 5 ma.) | $BV_{ebo}$ (10 micro-amps) range | $BV_{cbo}$ (10 micro-amps) range | $BV_{ceo}$ range (1 ma.) |
|---|---|---|---|---|---|---|---|
| J | 0,870 / 0.009 | 0.688 / 0.005 | 101 / 12 | 0.140 / 0.005 | 7.34–7.46 | 27–35 | 8.7–9.3 |
| M | 0.868 / 0.007 | 0.676 / 0.009 | 140 / 34 | 0.110 / 0.004 | 7.45–7.53 | 32–35 | 7.8–8.7 |
| P | 0.863 / 0.003 | 0.656 / 0.006 | 256 / 103 | 0.107 / 0.009 | 7.08–7.60 | 13–35 | 5.7–8.6 |

The definitions of the terms used in the foregoing table are as follows:

$FV_{beo}$ - Mean forward voltage of the transistor between the base and emitter with the collector open.

*d* - Deviation from mean.

$V_{bes}$ - Mean voltage between the base and the emitter with the collector to base shorted.

B - Mean Beta (average gain of device relative to varying base current).

$V_{ces}$ - Mean voltage between the collector and the emitter with the emitter to base shorted.

$BV_{cbo}$ - Breakdown voltage between the emitter and base with the collector open. $BV_{cbo}$ - Breakdown voltage between the collector and base with the emitter open.

$BV_{ceo}$ - Breakdown voltage between the collector and emitter with the base open.

As a result of the foregoing, a source concentration of 2000 ppm of $POCl_3$ is as effective as a source concentration of 4000 ppm of $POCl_3$ in controlling pipes. As shown in FIG. 2, wafers having a <100> crystal orientation have a substantially constant junction depth between 1500 ppm and 3000 ppm. Since the effect of pipes is negligible in this range, the desired operating range for source concentration of $POCl_3$ is from 1500 ppm to 3000 ppm because this also forms a substantially constant junction depth, $X_j$, in the device. Because of the known absence of pipes at a source concentration of 2000 ppm of $POCl_3$ and this source concentration is on the straight junction depth portion of the curve of FIG. 2 for <100> oriented wafers, the preferred operating point for <100> oriented wafers is a source concentration of 2000 of $POCl_3$.

For wafers having a <111> crystal orientation, the junction depth, $X_j$, reaches a maximum at a source concentration of 1500 ppm of $POCl_3$ and then decreases to a minimum at a source concentration of 2500 ppm of $POCl_3$. This is shown by the curve in FIG. 2 for <111> oriented wafers.

While there is no significant difference in the junction depth when the source concentration of $POCl_3$ varies from approximately 2500 ppm to 4000 ppm for <111> oriented wafers, there is a retardation of the phosphorous diffusion at this source concentration so that the lattice of the crystal structure is damaged at the surface. Therefore, it is not desirable to use a source concentration between 2500 ppm and 4000 ppm of $POCl_3$ for satisfactory production of <111> oriented wafers even though there are no pipes in this range.

Accordingly, the curve of FIG. 2 for <111> oriented wafers and the results hereinabove show that the range of source concentration of $POCl_3$ should be between 1000 ppm and 1500 ppm to produce satisfactory wafers with a <111> orientation. Because of the shape of the curve of FIG. 2 for <111> oriented wafers, it is preferred that the source concentration of $POCl_3$ be 1000 ppm even though there exists the possibility of occasional pipes. However, since the percentage of pipes is sufficiently low as indicated for Group E of the first run, for example, this is the preferred operating point for <111> oriented wafers.

Figure 3:
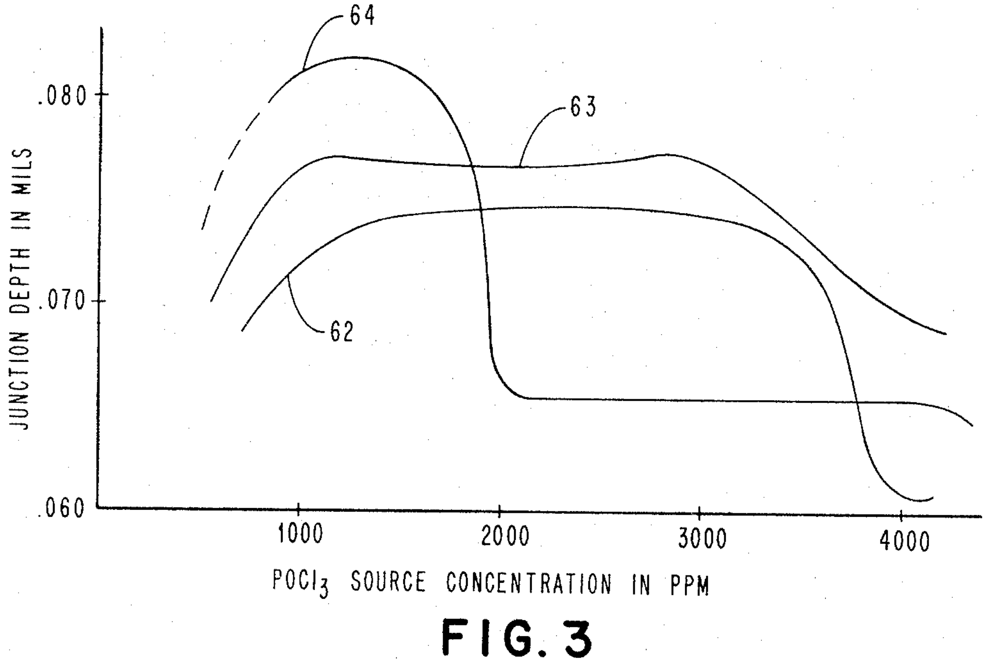
FIG. 3 is a graph showing the relationship of the junction epth to the phosphorous source concentration for <100> oriented substrates at various flow rates in various sized heating chambers.

Referring to FIG. 3, there are shown three curves 62–64 illustrating the relationship of the source concentration of $POCl_3$ relative to the junction depth of the wafer for different flow rates for different size heating chambers. Each of the wafers had a <100> orientation, and the diffusion temperature was 970° C.

Figure 2:
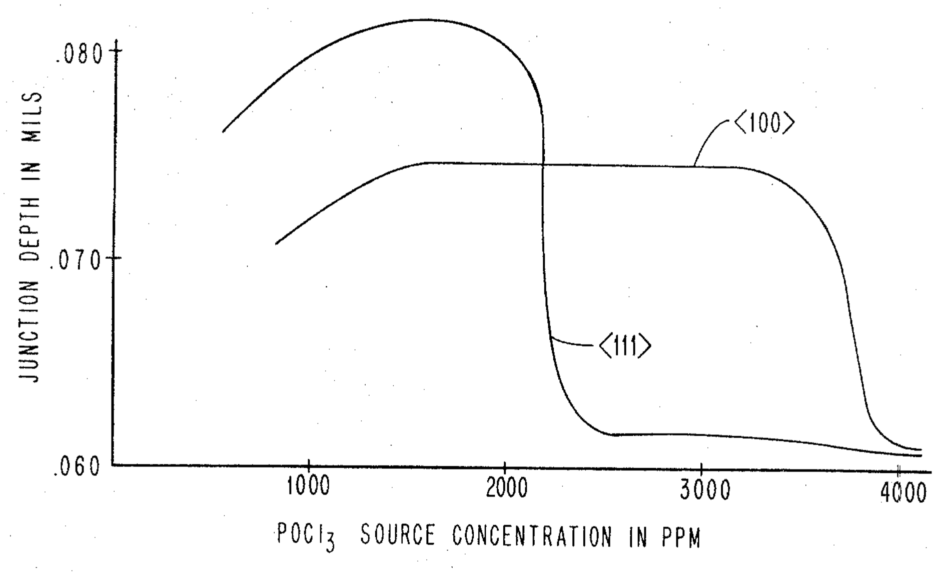
FIG. 2 is a graph showing the relationship of the junction depth to the phosphorous source concentration for <111> and <100> oriented substrates.

The curve 62 is the same as the curve of FIG. 2 for <100> orientation. That is, the curve 62 represents a flow rate of 21 liters/minute in a heating chamber having a cross section 49 mm. × 64 mm.

The curve 63 represents wafers disposed in a heating chamber having a square cross sectional area of 64 mm. × 64 mm. with a flow rate of 36 liters/minute and different source concentrations of $POCl_3$. The curve 63 is substantially straight between source concentrations of 1200 ppm and 2600 ppm of $POCl_3$.

The curve 64 represents wafers disposed in a heating chamber having a square cross sectional area of 43 mm. × 43 mm. with a flow rate of 7 liters/minute and different source concentrations of $POCl_3$. The curve 64 shows that this flow rate of 7 liters/minute for a heating chamber with a square cross sectional area of 43 mm. × 43 mm. does not produce a substantially constant junction depth in the wafers for a range of source concentration of $POCl_3$.

This is deemed to be due to the flow rate not being large enough for the cross sectional areaof the heating chamber. Accordingly, the flow rate must be selected sufficiently high if the junction depth is to be substantially constant through a range of source concentration of $POCl_3$.

It should be understood that each of the baffles 34–36 is spaced about one millimeter from the adjacent wall of the heating chamber 10 irrespective of whether the cross sectional area of the heating chamber 10 is 43 mm. × 43 mm., 49 mm.×64 mm. or 64 mm. × 64 mm. The baffle 37 terminates approximately half the depth of the eating chamber 10 irrespective of the size of the heating chamber 10.

An advantage of this invention is that adequate gettering occurs on the emitter of a transistor without any ragged junction in the transistor between the emitter and base. Another advantage of this invention is that more precise control of the junction of the emitter can be obtained.

While the present invention has been particularly shown and described with reference to a preferred embodiment thereof, it will be understood by those skilled in the art that various changes in form and details may be made therein without departing from the spirit and scope of the invention.

What is claimed:

1. A method for diffusing a substantially uniform phosphorous concentration in each of a plurality of wafers to obtain a substantially straight junction in each of the wafers comprising:

maintaining a heating chamber at a selected temperature directing a turbulent flow of a phosphorous gas in the presence of oxygen and an inert carrier gas over the wafers in the heating chamber at a selected flow rate;

selecting the flow rate in accordance with the cross sectional area of the heating chamber at a rate to maintain a turbulent gas flow and the maintenance of a uniform preselected temperature about the wafers;

selecting the concentration of the source of phosphorous in a range in which a straight junction is produced within each of the wafers when the selected flow rate occurs.

2. The method according to claim 1 in which the source of phosphorous is $POCl_3$.

3. The method according to claim 2 including:
maintaining the heating chamber at 970° C;
and selecting the source concentration of $POCl_3$ within the range of 1500 ppm to 3000 ppm when the crystal orientation of the wafer is <100>.

4. The method according to claim 3 in which the flow rate is in the range of 20 to 22 liters per minute when the cross sectional area of the heating chamber is 31.36 $cm^2$.

5. The method according to claim 3 in which the flow rate is approximately 36 liters per minute when the cross sectional area of the heating chamber is 40.96 $cm^2$.

6. The method according to claim 2 including:
maintaining the heating chamber at 970° C;
and selecting the source concentration of $POCl_3$ at 2000 ppm when the crystal orientation of the wafer is <100>.

7. The method according to claim 2 including: maintaining the heating chamber at 970° C; and selecting the concentration of $POCl_3$ within the range of 100 ppm to 1500 ppm when the crystal orientation of the wafer is <111>.

8. The method according to claim 7 in which the flow rate is in the range of 20 to 22 liters per minute when the cross sectional area of the heating chamber is 31.36 $cm^2$.

9. The method according to claim 7 in which the flow rate is approximately 36 liters per minute when the cross sectional area of the heating chamber is 40.96 $cm^2$.

* * * * *